United States Patent [19]

Pohl et al.

[11] 4,382,195
[45] May 3, 1983

[54] MONOLITHICALLY INTEGRABLE SEMICONDUCTOR CIRCUIT

[75] Inventors: Günter Pohl, Krailling; Gerald Mundel, Glonn, both of Fed. Rep. of Germany

[73] Assignee: Siemens Aktiengesellschaft, Berlin and Munich, Fed. Rep. of Germany

[21] Appl. No.: 208,319

[22] Filed: Nov. 19, 1980

[30] Foreign Application Priority Data

Nov. 26, 1979 [DE] Fed. Rep. of Germany ....... 2947599

[51] Int. Cl.³ ...................... H03K 3/33; H03K 3/353; H01L 27/02
[52] U.S. Cl. .................................. 307/280; 307/255; 307/300; 357/44; 330/298
[58] Field of Search ............... 307/280, 270, 300, 303, 307/255; 357/44; 330/298

[56] References Cited

U.S. PATENT DOCUMENTS 3,482,111 12/1969 Gunderson et al. ................. 307/300
3,845,405 10/1974 Leidich ............................... 307/300
4,021,687 5/1977 Yoshimura .......................... 307/300

*Primary Examiner*—Stanley D. Miller
*Assistant Examiner*—B. P. Davis
*Attorney, Agent, or Firm*—Herbert L. Lerner; Laurence A. Greenberg

[57] ABSTRACT

Monolithically integrable semiconductor circuit, including at least one npn-transistor and at least one pnp-transistor, contacts for voltage supply, at least one of a signal input and output, and means connecting at least one of the transistors in the form of a transistor to be protected to another of the transistors being of the complementary type to the at least one transistor to be protected for causing the other transistor without being connected as a diode to react to a minimum value of current controlling the at least one transistor to be protected and then due to its protection function to prevent the at least one transistor to be protected from being overdriven, the at least one transistor to be protected being in the form of a power transistor.

2 Claims, 8 Drawing Figures

MONOLITHICALLY INTEGRABLE SEMICONDUCTOR CIRCUIT

The invention relates to a monolithically integrable semiconductor circuit with at least one npn-transistor and at least one pnp-transistor, with the contacts required for the voltage supply as well as with at least one signal input and/or signal output, in which at least one of the transistors provided is protected by appropriate connection to a semiconductor element that prevents the occurrence of the saturation state of this transistor.

In this connection, it should first be said that in an overdriven transistor, i.e., in the case of saturation, the collector-base diode of the overdriven transistor becomes conducting, and a diffusion capacity is therefore built up therein. If the transistor is then switched into the cut-off state, this diffusion capacity must be discharged. This means that a loss of time will occur which may, for instance, in low-frequency power amplifiers, be very troublesome. In such amplifiers, the transition into the saturated state can, for instance, lead to an undesirable increase of the distortion at higher frequencies. This problem also arises in the output transistors of power amplifiers. The currents flowing there frequently rise up to several amps and further require a uniform distribution in the individual zones of this transistor.

In one heretofore-known prior art device for preventing the occurrence of saturation in a transistor, the anode of a Schottky diode is connected to the base of the transistor to be protected, while the cathode of the Schottky is connected to the collector of this transistor. The transistor is operated, for instance, in a common emitter circuit.

In another heretofore-known construction, there is provided a diode network which is acted upon on the one hand by the base lead, and on the other hand by the collector lead of the transistor to be protected, and which like the Schottky diode has the purpose of taking the current causing the overdrive away from the transistor, in the event of a troublesome saturation of the transistor before saturation occurs. In this manner the voltage of the conducting transistor in an npn-transistor can, for example, be limited to about 0.7 V.

This may be accomplished by a circuit in which in an npn-transistor is operated in a common emitter circuit, the collector-base path is bridged by two identical diodes, the anodes thereof being connected to a circuit point supplying the potential for the base lead, and the cathode of one diode is connected to the collector of the transistor while the cathode of the other diode is connected to the base of this transistor.

It is a disadvantage for the use of the known circuits for preventing saturation that they either require a large drive current, as in the first-mentioned device, or they increase the output voltage of the switched-on transistor in an undesirable manner. Furthermore, the fabrication becomes more complicated if monolithic realization is desired, especially with respect to the increased space requirement of the integrated circuit caused thereby.

In this connection, the following can now be said:

Power transistors, such as are required primarily in amplifiers, should avoid saturation in the interest of reducing distortion (particularly at audio frequencies) as well as in the interest of suppressing a parasitic low-pass effect or phase shift and parasitic oscillations, as far as possible.

It is accordingly an object of the invention to provide a monolithically integrable semiconductor circuit which overcomes the hereinafore-mentioned disadvantages of the heretofore-known devices of this general type, and which is suitable for accomplishing this goal, which has a use that is suitable especially for low-frequency amplifiers, and which permits a space-saving monolithic realization.

With the foregoing and other objects in view there is provided, in accordance with the invention, a monolithically integrable semiconductor circuit, comprising at least one npn-transistor and at least one npn-transistor, contacts for voltage supply, at least one of a signal input and/or signal output in which at least one of the transistors provided is protected by appropriate connection to a semiconductor element which prevents the occurrence of the saturation state of this transistor, and means connecting at least one of the transistors in the form of a transistor to be protected to another of the transistors being of the complementary type to the at least one transistor to be protected for causing the other transistor without being connected as a diode to react to a minimum value of current controlling the at least one transistor to be protected and then due to its protection function to prevent the at least one transistor to be protected from being overdriven, the at least one transistor to be protected being in the form of a power transistor.

In accordance with another feature of the invention, there is provided a first and a second resistor, the at least one signal input and output being in the form of one input and one output, the collector of the at least one transistor to be protected and the base of the other transistor being connected to each other and to the output, the base of the at least one transistor to be protected being connected to the input and to the emitter of the other transistor through the first resistor, and the base of the at least one transistor to be protected being connected through the second resistor to the emitter of the at least one transistor to be protected.

In accordance with a further feature of the invention, the contacts for voltage supply are in the form of a first and second supply potential, the first supply potential being for supply of the at least one transistor to be protected and being connected to the emitter of the at least one transistor to be protected, and the second supply potential being connected to the emitter of the other transistor.

In accordance with an added feature of the invention, there is provided a current supply connected between the second supply potential and the emitter of the other transistor.

In accordance with a concomitant feature of the invention, there is provided a semiconductor substrate having a buried-layer zone with at least one gap formed therein, and a single-crystal epitaxial layer having the same conduction type as the collector of the at least one transistor to be protected on which the at least one transistor to be protected is generated, the at least one transistor to be protected being generated in the epitaxial layer in such a manner relative to the gap on the basis of the at least one transistor to be protected to provide the other transistor and a required path resistance between the base of the other transistor and the collector of the at least one transistor to be protected.

Other features which are considered as characteristic for the invention are set forth in the appended claims.

Although the invention is illustrated and described herein as embodied in a monolithically integrable semiconductor circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which.

Figure 1:
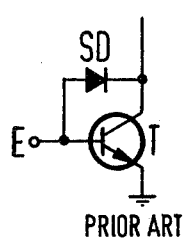
FIG. 1 is a schematic circuit diagram of a prior art circuit for preventing transistor saturation.

Referring now to the figures of the drawings and first, particularly, to FIG. 1 thereof, it is seen that in one known method for preventing the occurrence of saturation in a transistor, the anode of a Schottky diode SD is connected to the base of the transistor to be protected, while the cathode of the Schottky is tied to the collector of this transistor T. The transistor is operated, for instance, in a common emitter circuit.

Figure 2:
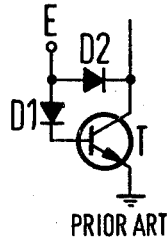
FIG. 2 is a schematic circuit diagram of another prior art circuit.

Another known possibility is shown in FIG. 2. It provides a diode network which is acted upon on the one hand by the base lead, and on the other hand by the collector lead of the transistor to be protected. The diode network has the purpose, like the Schottky diode SD, to take the current causing the overdrive away from the transistor, in the event of a troublesome saturation of the transistor, before saturation occurs. In this manner the voltage of the conducting transistor, for instance, in an npn-transistor can be limited to about 0.7 V.

This is accomplished, for instance, by the circuit shown in FIG. 2, in which in an npn-transistor T operated in a common emitter circuit, the collector-base path is bridged by two identical diodes D1 and D2. In such a circuit the anodes of the two diodes D1 and D2 are connected to a circuit point E supplying the potential for the base lead. The cathode of the diode D2 is connected to the collector of the transistor T, and the cathode of the diode D1 is connected to the base of the transistor T.

Figure 3:
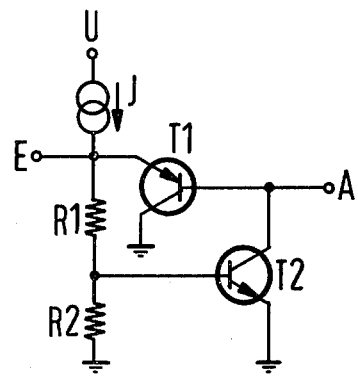
FIGS. 3 and 4 are schematic circuit diagrams of a circuit for protecting an npn and a pnp power transistor, respectively.
Figure 4:
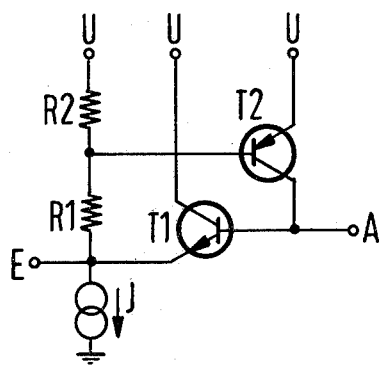

FIGS. 3 and 4 show the construction of the corresponding circuit principle which is suitable for a power transistor. The transistor to be protected against saturation is designated with reference numeral $T_2$, and the complementary transistor with $T_1$. U represents the supply potential and J represents the drive current which is obtained from a current source and drives the power transistor. The resistor $R_2$ serves to set the operating point and for clearing out the power transistor $T_2$ to be protected. Through the use of the resistor $R_1$ together with the current source J, for instance, a constant-current source, the collector-emitter voltage $U_{E(T_2)}$ for the power transistor $T_2$ to be protected, and accordingly the degree of saturation of $T_2$, can be set. The overdrive current of $T_2$ is taken away by the transistor $T_1$ if the following condition is met:

$$U_{BE(T_2)} + JR_1 \geq U_{BE(T_1)} + U_{CE(T_2)}$$

where $U_{BE(T_2)}$ and $U_{BE(T_1)}$ are the base-emitter voltages of $T_2$ and $T_1$, respectively.

In order to ensure that the desired effect comes about, the transistor to be protected (an npn-transistor) is connected in the circuit shown in FIG. 3 with its collector connected to the base of the complementary transistor $T_1$ (i.e. of a pnp-transistor) the collector of which is, for instance, at the same potential as the emitter of the transistor $T_2$ to be protected. The current source J is connected to the supply potential and in series with the two resistors $R_1$, $R_2$. They are further connected to the emitter of the complementary transistor $T_1$ and, through the resistor $R_1$, to the base of the transistor $T_2$ to be protected. Finally, the transistor to be protected in the case of the example is operated in the common emitter mode and therefore the complementary transistor $T_1$ is operated in a common-collector circuit, by connecting the collector of $T_1$ and the emitter of $T_2$ to the reference potential. The constant-current source J is operated, on the one hand, by the operating potential U and on the other hand, by the reference potential due to the hereinafore-described connection. The input E of the circuit is connected to the emitter of the complementary transistor $T_1$, and the output A of the circuit is connected to the collector of the power transistor $T_2$ to be protected.

In the circuit shown in FIG. 4, the transistor $T_2$ to be protected is a pnp-transistor and accordingly, the protective transistor $T_1$ is an npn-transistor. Otherwise, the construction of the circuit corresponds to FIG. 3 with the only exception being that the first supply potential U and the reference potential are interchanged.

Figure 5:
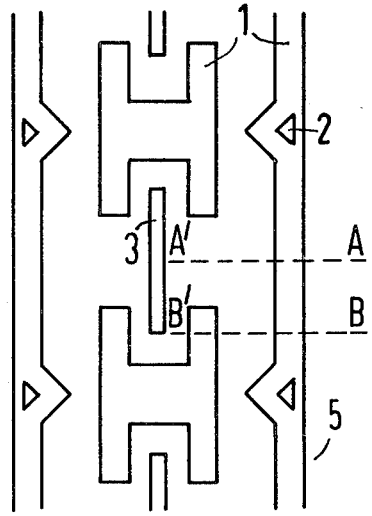
FIG. 5 is a diagrammatic top plan view of a monolithically integrated circuit of a prior art device.
Figure 6:
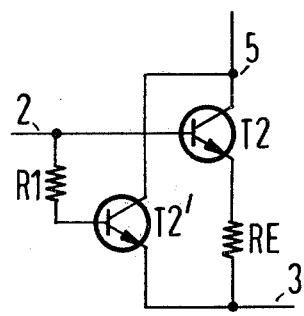
FIG. 6 is a schematic circuit diagram corresponding to FIG. 5.

The following is a description of the embodiment of the invention which is set forth by means of an npn power transistor as compared to the state of the art. The layout in monolithically integrated circuit technology, as seen from the top, is shown in the known case in FIG. 5 and in the case of the invention in FIG. 7. FIG. 6 shows the equivalent circuit belonging to FIG. 5, and FIG. 8 shows the equivalent circuit belonging to FIG. 7.

The zone designated with reference numeral 1 at the surface of a silicon crystal of one conduction type is redoped by the base diffusion. Reference numeral 2 represents the base contact. The emitter 4 is connected through the contact 3. The collector region 5 is underlaid over the whole area with a buried layer. The transistor $T_2$ proper acts along the line A-A', and the parasitic transistor $T_2'$ acts along the line B-B'. The transistor $T_2$ to be protected has an emitter resistor $R_E$ connected for negative feedback in the known manner, and carries, for instance, 8-times the current of the parasitic transistor $T_2'$ because of the larger base-emitter area. Due to the layout, a base series resistor which carries the reference symbol $R_1$ is brought about in view of the construction according to the invention to be described by means of FIGS. 7 and 8. This resistor $R_1$ has no significance for the construction according to the state of the art.

A typical example exhibits the following values: $R_E=3$ ohm, $R_1=3$ kohm. The collector current of the transistor $T_2$ forming the amplifier, i.e., the current $J_{C2}$ is 64 mA, while the collector current of the parasitic transistor $T_2'$, $J_{C2}'$, amounts to about 8 mA. The base current of the transistor $T_2$, i.e., the current $J_{B2}$ is about 0.4 mA, and the base current of the parasitic transistor $T_2'$ is about 50 μA.

It is now a substantial advantage for the invention that the parasitic transistor $T_2'$ and the basically parasitic resistor $R_1$ can be used beneficially. The construction of the amplifier according to FIGS. 5 and 6 in the sense of the invention will now be described, making reference to FIGS. 7 and 8. The layout is shown in FIG. 7 and the corresponding circuit diagram in FIG. 8.

Figure 7:
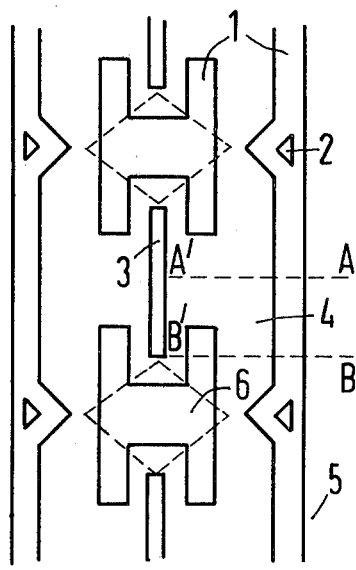
FIG. 7 is a diagrammatic top plan view of a monolithically integrated circuit of the invention.
Figure 8:
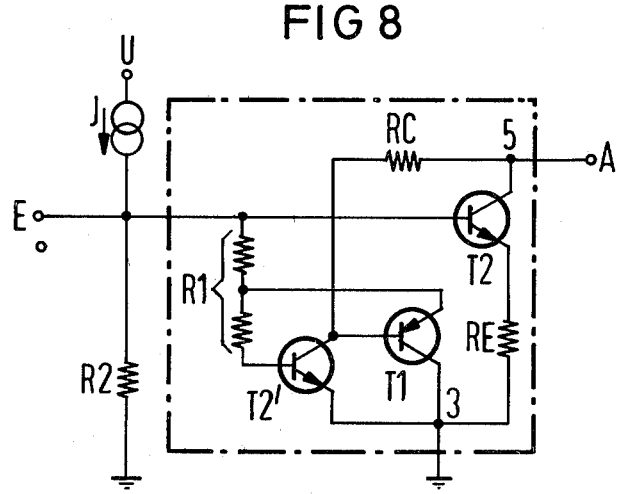
FIG. 8 is a schematic diagram corresponding to FIG. 7.

Contrary to the known embodiment according to FIG. 5, the collector region in the embodiment according to FIG. 7 is not fully underlaid by a buried layer, but the buried layer is rather recessed at the diamond-shaped gaps. These gaps are designated with reference numeral 6 and are located on both sides of the emitter electrode 3 below the two R-shaped recesses of the emitter zone, in which the base doping reaches the silicon surface. The interruptions of the buried layers may also have other shapes and need not be subdivided as they are in the case of the example. Their effect is to generate a substrate transistor $T_1$ at this point and to form a collector path resistance $R_C$ for the parasitic transistor $T_2'$.

It should be noted here that the individual manufacturing steps are embodied in single-crystal silicon having one conduction type being deposited on a substrate of the opposite conduction type and the former is further processed into the transistor $T_2$. The buried layer is generated in the manner known per se at the substrate surface before it is epitaxially coated. The emitter and base are generated by localized diffusion and/or implantation.

The substrate transistor $T_1$, brought about by the interruptions L in the buried layer now has the purpose of protecting the transistor $T_2$ forming the amplifier against undesirable oversaturation. Based on the layout shown in FIG. 7, the circuit diagram shown in FIG. 8 is obtained, the parts belonging to the layout according to FIG. 7 being enclosed by the dot-dash box. In the case of this example, the substrate is p-doped, the buried layer is n+-doped, the collector of $T_2$ and therefore, the epitaxial layer are n-doped, the base is p-doped and the emitter of $T_2$ is n+-doped.

The npn-transistor $T_2$ in FIG. 8 which was generated in the epitaxial layer and forms the desired amplifier is connected, due to the embodiment shown in FIG. 7, with the emitter thereof through the emitter resistor $R_E$ to a node 3 (the emitter electrode) to which the emitter of a parasitic transistor $T_2'$ that is also of the npn-type and produced by the layout is also connected. The collector of the npn-transistor $T_2$ forming the amplifier is connected to the collector electrode 5 which simultaneously forms the output of the amplifier and is connected to the collector of the parasitic npn-transistor $T_2'$ through the resistance $R_C$ represented by the path within the collector zone of $T_2$. Meanwhile the emitter of $T_2$ is connected through the resistor $R_E$ to the emitter electrode 3 (to which the emitter of the parasitic npn-transistor $T_2'$ is automatically also connected).

The complementary protection transistor $T_1$ is connected with the base thereof to the collector of the parasitic npn-transistor $T_2'$ and with the collector thereof to the emitter electrode 3 of the npn-transistor $T_2$ and therefore also to the emitter of the parasitic npn-transistor $T_2'$. The emitter of $T_1$ is connected to the tap of a voltage divider, one end of which is connected to the base of the npn-transistor $T_2$ to be protected and the other end of which is connected to the base of the parasitic transistor $T_2'$. The voltage divider is designated with reference symbol $R_1$, since according to its effect it corresponds to the resistor $R_1$ of the protective circuit shown in FIGS. 3 and 4.

The external circuit portion is provided as the resistor $R_2$, the current source J and the supply terminals as well as the signal terminals E and A, i.e., the signal input and the signal output. One supply terminal provides the reference potential which is connected to the emitter electrode 3 as well as to the end of the external resistor $R_2$ which is not connected to the base of the npn-transistor $T_2$ to be protected. The other supply potential U is made operative through the current source that is provided, for instance, by an appropriate transistor circuit.

As long as the collector-emitter voltage of the transistor $T_2$ to be protected (and thereby of the parasitic transistor $T_2'$) is still above the saturation voltage, the complementary protection transistor $T_1$ remains cut off. With increasing tendency towards saturation, the collector-emitter voltage of the parasitic transistor $T_2'$ drops faster than the collector-emitter voltage of the transistor $T_2$ to be protected, because of the presence of the resistance $R_C$. This makes the protection transistor $T_1$ conduct the excess drive current away from the base 2 toward the substrate. Thus, saturation of the transistor $T_2$ to be protected is prevented and the parasitic transistor $T_2'$ comes only into the state of partial saturation.

In the monolithic embodiment of a power transistor $T_2$, the latter will now be formed as several sectional transistors, as can already be seen from FIGS. 5 and 7. These transistors are then connected in parallel and are internally or externally connected with their base terminals to a common base terminal, and with their emitters to a common second terminal, as well as with their collectors to a common third terminal. A nonuniform power distribution at an operating point shortly before saturation is made difficult in an embodiment according to the invention since then, at points of higher power density, the temperature rise of the resistance $R_C$ connected therewith is increased and the evaluation current from the transistor $T_2$ representing the amplifier is locally decreased there, and the drive current for the complimentary protection transistor $T_1$ is first decreased there locally.

In summary, the following can be said for the embodiment of the invention according to FIGS. 7 and 8. The first advantage to be listed is the prevention of saturation of the transistor $T_2$ without additional circuit means, without additional current drain, without additional space requirements and without additional technological effort (if one disregards the special construction of the doping mask required for generating the gaps L in the buried layer zone). Furthermore, a more uniform power distribution with the transistor $T_2$ in conduction is obtained.

Modifications in the generation of a protective circuit according to FIGS. 3 and 4 are possible without difficulty. Thus, the complementary protection transistor $T_1$, for instance, can be made in an insulating trough which is separate and therefore independent of the transistor $T_2$, in the epitaxial silicon layer. Likewise, the resistor $R_1$ can be generated in a separate insulating trough which is independent of the two transistors $T_2$ and $T_1$.

Experimentally, the following comparative values between an amplifier transistor constructed in the conventional manner and an otherwise identical amplifier transistor improved by the protective circuit according to the invention were determined, and the value of the invention was thereby confirmed.

| Transistor | Residual Voltage | Switching off Delay |
|---|---|---|
| State of the art | 600 mV | 520 ns |
| Invention | 670 mV | 140 ns | where the collector current is set to 1 A, and the current gain B to 50. If the conditions are modified, the advantages obtainable by use of the invention remain assured in any case. A not yet mentioned advantage, which can be seen from the table, is the increased switching speed when the power transistor is switched off. The increased switching speed is almost 4 times that of a transistor without the protective circuit according to FIG. 3 or 4.

The advantage of this considerable reduction of the switching-off delay in the power transistor according to the invention is of special importance for all circuits in which the maximum speed of the signal processing is influenced in the power transistor. This is because an expansion of the base width comes about in power transistors because of the large amount of current injection taking place there, and therefore a larger storage volume in the base, and as a consequence thereof, long switching-off delays.

There are claimed:

1. Monlithically integrable semiconductor amplifier circuit, comprising a first bipolar power transistor, a transistor being complementary to said first transistor, a further transistor being of the same type as said first transistor, a signal input of the circuit being directly connected to the base of said first transistor, a signal output of the circuit being directly connected to the collector of said first transistor, a first resistor connected between the collector of said first transistor and the base of said complementary transistor as well as the collector of said further transistor, at least one reference potential source, a second resistor connected between said at least one reference potential source and said signal input, two resistors being connected together in series with a divider point disposed therebetween, said series connected resistors being connected between said signal input and the base of said further transistor, the emitter of said complementary transistor being directly connected to said divider point, a circuit node, and a third resistor connected between said circuit node and the emitter of said first transistor, the emitter of said further transistor, the collector of said complementary transistor and said at least one reference potential source each being connected to said circuit node.

2. Circuit according to claim 1, including a substrate, a buried layer zone being disposed in said substrate and having a gap formed therein, an epitaxial silicon layer being disposed on said substrate and having the same conduction type as the collector of said first transistor, said first transistor and said further transistor being provided in said epitaxial layer, said first transistor being disposed in said epitaxial layer relative to said gap in such a manner that because of said first transistor said complementary transistor and said first resistor connected between the collector of said first transistor and the base of said complementary transistor are provided, the emitter of said first transistor being disposed in vicinity of said node connected to said emitter of said first transistor, said gap for said complementary transistor being disposed opposite the base zone, and said further transistor being a parasitic transistor enclosing said series-connected, second and third resistors and the connections thereof to said transistors.

* * * * *